(12) United States Patent
Romero et al.

(10) Patent No.: US 11,270,887 B2
(45) Date of Patent: Mar. 8, 2022

(54) PASSIVATION LAYER FOR GERMANIUM SUBSTRATE

(71) Applicant: Intel Corporation, Santa Clara, CA (US)

(72) Inventors: Patricio E. Romero, Portland, OR (US); Scott B. Clendenning, Portland, OR (US); Florian Gstrein, Portland, OR (US); Cen Tan, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/637,177

(22) PCT Filed: Sep. 27, 2017

(86) PCT No.: PCT/US2017/053843
§ 371 (c)(1),
(2) Date: Feb. 6, 2020

(87) PCT Pub. No.: WO2019/066825
PCT Pub. Date: Apr. 4, 2019

(65) Prior Publication Data
US 2020/0168462 A1 May 28, 2020

(51) Int. Cl.
*H01L 21/02* (2006.01)
*H01L 21/28* (2006.01)
(Continued)

(52) U.S. Cl.
CPC ...... *H01L 21/28255* (2013.01); *H01L 21/022* (2013.01); *H01L 21/02052* (2013.01);
(Continued)

(58) Field of Classification Search
CPC ......... H01L 21/28255; H01L 21/02052; H01L 21/022; H01L 21/02304; H01L 21/02381; H01L 21/306; H01L 29/517
(Continued)

(56) References Cited

U.S. PATENT DOCUMENTS 6,406,945 B1 6/2002 Lee et al.
2006/0292872 A1 12/2006 Haukka et al.
(Continued)

OTHER PUBLICATIONS

International Search Report and Written Opinion for International Patent Application No. PCT/US2017/053843 dated Feb. 28, 2018, 14 pgs.
(Continued)

*Primary Examiner* — David Vu
*Assistant Examiner* — Brandon C Fox
(74) *Attorney, Agent, or Firm* — Schwabe, Williamson & Wyatt, P.C.

(57) ABSTRACT

Embodiments herein describe techniques for a semiconductor device including a Ge substrate. A passivation layer may be formed above the Ge substrate, where the passivation layer may include one or more molecular monolayers with atoms of one or more group 15 elements or group 16 elements. In addition, a low-k interlayer may be above the passivation layer, and a high-k interlayer may be above the low-k interlayer. Furthermore, a metal contact may be above the high-k interlayer. Other embodiments may be described and/or claimed.

26 Claims, 6 Drawing Sheets

(51) Int. Cl.
*H01L 21/306* (2006.01)
*H01L 29/51* (2006.01)

(52) U.S. Cl.
CPC .. *H01L 21/02304* (2013.01); *H01L 21/02381* (2013.01); *H01L 21/306* (2013.01); *H01L 29/517* (2013.01)

(58) Field of Classification Search
USPC ........................................................ 257/288
See application file for complete search history.

(56) References Cited

U.S. PATENT DOCUMENTS

| | | |
|---|---|---|
| 2008/0157365 A1 | 7/2008 | Ott et al. |
| 2009/0215439 A1* | 8/2009 | Hamilton .............. H04M 1/605 455/418 |
| 2010/0006826 A1 | 1/2010 | Dimmler |
| 2011/0089520 A1* | 4/2011 | Lieten ................... C30B 29/403 257/472 |
| 2014/0109930 A1* | 4/2014 | Kaufman-Osborn ........................ H01L 21/28255 134/1.2 |
| 2015/0170914 A1* | 6/2015 | Haukka ............. C23C 16/45525 438/478 |
| 2016/0190286 A1 | 6/2016 | Wang et al. |

OTHER PUBLICATIONS

International Preliminary Report on Patentability for International Patent Application No. PCT/US2017/053843, dated Apr. 9, 2020, 11 pgs.

\* cited by examiner

| 209 | 207 | 205 | 213 | 203 | 201 |
|---|---|---|---|---|---|

| 109 | 107 | 105 | 103 | 101 |
|---|---|---|---|---|

PASSIVATION LAYER FOR GERMANIUM SUBSTRATE

CROSS-REFERENCE TO RELATED APPLICATION

This patent application is a U.S. National Phase Application under 35 U.S.C. § 371 of International Application No. PCT/US2017/053843, filed Sep. 27, 2017, entitled "PASSIVATION LAYER FOR GERMANIUM SUBSTRATE," which designates the United States of America, the entire disclosure of which is hereby incorporated by reference in its entirety and for all purposes.

FIELD

Embodiments of the present disclosure generally relate to the field of integrated circuits, and more particularly, to semiconductor devices.

BACKGROUND

Silicon has long been a pillar of the semiconductor industry, allowing the integration of new materials, progressive scaling, and the continuation of Moore's law. However, future demands of high-speed microprocessors may benefit from the use of higher mobility semiconducting materials such as germanium (Ge), whose mobility may exceed silicon mobility by multiple times. On the other hand, germanium may form an ill-defined dielectric oxide interface composed of stoichiometric and sub-stoichiometric oxides. The low quality germanium to germanium-oxide interface may have a high density of trapped states that may significantly degrade device performance. Thus, surface modification of a germanium substrate to remove oxygen from a germanium-oxide interface may be important to many future planar and three dimensional nanostructure devices. However, oxygen may be notoriously difficult to remove from germanium interfaces. Methods to modify the poor quality germanium-oxide surface layer may be hard to find.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

FIG. 1 schematically illustrates a diagram of a semiconductor device with a germanium (Ge) substrate and one or more molecular monolayers formed passivation layer above the Ge substrate, in accordance with some embodiments.

FIG. 2 schematically illustrates a diagram of another semiconductor device with a Ge substrate and one or more molecular monolayers formed passivation layer above the Ge substrate, in accordance with some embodiments.

DETAILED DESCRIPTION

Figure 3:
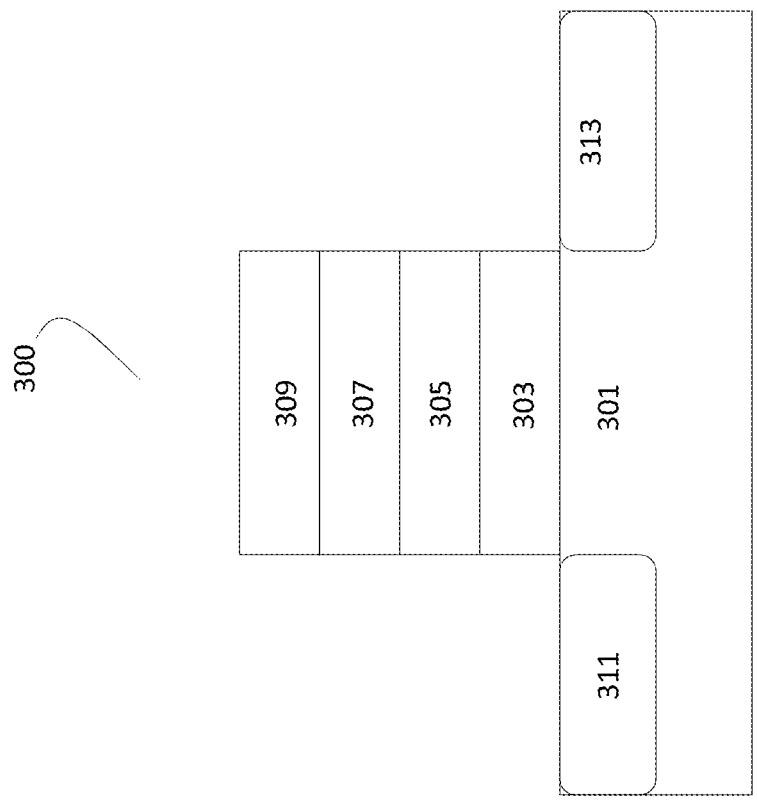
FIG. 3 schematically illustrates a diagram of a transistor including a Ge substrate and one or more molecular monolayers formed passivation layer above the Ge substrate, in accordance with some embodiments.

The quality of a germanium (Ge) to germanium-oxide interface may influence the performance of a device on a Ge substrate. Some current methods may remove some oxide from a germanium-oxide interface to produce a chemically functionalized surface for the Ge substrate. However, some oxide may still exist at the germanium-oxide interface after performing current methods. In addition, some current methods may be mostly based on ex-situ wet clean approaches that involve air exposure prior to downstream processing. The air exposure prior to the deposition of a next layer may inevitably lead to a partial reformation of the undesired germanium-oxide surface layer. In addition, some other methods may be cumbersome and not efficient for large-scale manufacturing.

Embodiments herein may employ in-situ removal of surface germanium oxide on a Ge substrate. As by-products, one or more molecular monolayers may be formed as a passivation layer at the surface of the Ge substrate while removing the surface germanium oxide. In detail, one or more molecular monolayers may be formed as a passivation layer using vapor phase passivants or under potential deposition (UPD) of one or more of sulfur (S), selenium (Se), tellurium (Te), nitrogen (N), phosphorus (P), arsenic (As), antimony (Sb), or bismuth (Bi). In addition, the in-situ removal of surface germanium oxide may avoid re-oxidation to form an undesirable and ill-defined $GeO_x$ layer. Embodiments herein may be used for both gate and contact applications in semiconductor devices.

In embodiments, a semiconductor device may include a Ge substrate. A passivation layer may be formed above the Ge substrate, where the passivation layer may include one or more molecular monolayers with atoms of one or more group 15 elements or group 16 elements. In addition, a low-k interlayer may be above the passivation layer, and a high-k interlayer may be above the low-k interlayer. Furthermore, a metal contact may be above the high-k interlayer.

Embodiments herein may present a computing device that includes a processor and a memory device coupled to the processor. The processor or the memory device may include a transistor, where the transistor may include a Ge substrate and a passivation layer above the Ge substrate. The passivation layer may include one or more molecular monolayers with atoms of one or more group 15 elements or group 16 elements. Furthermore, the transistor may include a low-k interlayer above the passivation layer, a high-k interlayer above the low-k interlayer, and a metal contact above the high-k interlayer.

In embodiments, a method for forming a semiconductor device may include: performing an initial cleaning of a Ge substrate using mineral acid to produce a halogen terminated Ge surface for the Ge substrate; removing at least a part of remaining oxygen from the halogen terminated Ge surface and forming a passivation layer above the Ge substrate. In embodiments, the passivation layer may include one or more molecular monolayers with atoms of one or more group 15 elements or group 16 elements. The method may further include forming in-situ a low-k interlayer above the passivation layer; forming a high-k interlayer above the low-k interlayer; and forming a metal contact above the high-k interlayer.

In the following description, various aspects of the illustrative implementations will be described using terms commonly employed by those skilled in the art to convey the substance of their work to others skilled in the art. However, it will be apparent to those skilled in the art that the present disclosure may be practiced with only some of the described aspects. For purposes of explanation, specific numbers, materials and configurations are set forth in order to provide a thorough understanding of the illustrative implementations. However, it will be apparent to one skilled in the art that the present disclosure may be practiced without the specific details. In other instances, well-known features are omitted or simplified in order not to obscure the illustrative implementations.

Various operations will be described as multiple discrete operations, in turn, in a manner that is most helpful in understanding the present disclosure. However, the order of description should not be construed to imply that these operations are necessarily order dependent. In particular, these operations may not be performed in the order of presentation.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The terms "over," "under," "between," "above," and "on" as used herein may refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

Where the disclosure recites "a" or "a first" element or the equivalent thereof, such disclosure includes one or more such elements, neither requiring nor excluding two or more such elements. Further, ordinal indicators (e.g., first, second, or third) for identified elements are used to distinguish between the elements, and do not indicate or imply a required or limited number of such elements, nor do they indicate a particular position or order of such elements unless otherwise specifically stated.

As used herein, the term "circuitry" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. As used herein, "computer-implemented method" may refer to any method executed by one or more processors, a computer system having one or more processors, a mobile device such as a smartphone (which may include one or more processors), a tablet, a laptop computer, a set-top box, a gaming console, and so forth.

Implementations of the disclosure may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present disclosure.

A plurality of transistors, such as metal-oxide-semiconductor field-effect transistors (MOSFET or simply MOS transistors), may be fabricated on the substrate. In various implementations of the disclosure, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the disclosure may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type work function metal or N-type work function metal, depending on whether the transistor is to be a PMOS or an NMOS transistor. In some implementations, the gate electrode layer may consist of a stack of two or more metal layers, where one or more metal layers are work function metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a work function that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a work function that is between about 3.9 eV and about 4.2 eV.

In some implementations, when viewed as a cross-section of the transistor along the source-channel-drain direction, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

In some implementations of the disclosure, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process operations. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

FIG. 1 schematically illustrates a diagram of a semiconductor device 100 with a Ge substrate 101 and one or more molecular monolayers formed passivation layer 103 above the Ge substrate 101, in accordance with some embodiments. For clarity, features of the semiconductor device 100, the Ge substrate 101, and/or the passivation layer 103, may be described below as examples for understanding an example semiconductor device, a Ge substrate, and/or a passivation layer. It is to be understood that there may be more or fewer components within a semiconductor device, a Ge substrate, and/or a passivation layer. Further, it is to be understood that one or more of the components within a semiconductor device, a Ge substrate, and/or a passivation layer, may include additional and/or varying features from the description below, and may include any device that one having ordinary skill in the art would consider and/or refer to as a semiconductor device, a Ge substrate, and/or a passivation layer.

In embodiments, the Ge substrate 101 may be of 100, 111, or 110 crystallographic orientation. The passivation layer 103 may be above the Ge substrate 101. The passivation layer 103 may be include one or more molecular monolayers with atoms of one or more group 15 elements or group 16 elements. A low-k interlayer 105 may be above the passivation layer 103. A high-k interlayer 107 may be above the low-k interlayer 105, and a metal contact 109 may be above the high-k interlayer 107.

In embodiments, the passivation layer 103 may include one or more molecular monolayers, and may include molecules of Ge(E), $GeE_xO_y$, or $GeME_xO_y$, where E may be one or more of S, Se, Te, N, P, As, Sb, or Bi, and M may be one or more of aluminum (Al), gallium (Ga), indium (In), scandium (Sc), yttrium (Y), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu). The passivation layer 103 may have a thickness in a range of about 1 angstrom (Å) to about 10 Å. In some embodiments, the passivation layer 103 may include more than one molecular monolayer, while in some other embodiments, the passivation layer 103 may include one molecular monolayer. The passivation layer 103 may include substantially one or more molecular monolayers, which may have some variations from a perfect molecular monolayer. In embodiments, one or more molecular monolayers may include substantially one or more molecular monolayers, which may be caused by various process and fabrication techniques.

In embodiments, the low-k interlayer 105 may include materials with a small or comparable dielectric constant to dielectric constant relative to silicon dioxide (SiO2). For example, the low-k interlayer 105 may include $MO_x$, MON, $MSiO_x$, or $MGeO_x$, where M may be one or more of Al, Ga, In, Sc, Y, La, Ce, Pr, Nd, Sm, Eu, Gd, Tb, Dy, Ho, Er, Tm, Yb, or Lu. The low-k interlayer 105 may have a thickness in a range of about 3 Å to about 20 Å. The low-k interlayer 105 may be formed by atomic layer deposition (ALD) or chemical vapor deposition (CVD).

In embodiments, the high-k interlayer 107 may include materials with a high dielectric constant κ as compared to silicon dioxide. The high-k interlayer 107 may be used in semiconductor manufacturing processes where the high-k interlayer 107 may replace a silicon dioxide gate dielectric or another dielectric layer of a device. The high-k interlayer 107 may include $MO_x$, $MSiO_x$, or $MGeO_x$, wherein M may be one or more of Al, Ga, In, Sc, Y, La, Ce, Pr, Nd, Sm, Eu, Gd, Tb, Dy, Ho, Er, Tm, Yb, Lu, hafnium (Hf), or zirconium (Zr). The high-k interlayer 107 may have a thickness in a range of about 10 Å to about 50 Å. An M element in the high-k interlayer 107 may be different from an M element in the low-k interlayer 105. For example, if the low-k interlayer 105 may include $YO_x$, Y may not be included in the high-k interlayer 107. The high-k interlayer 107 may be formed by ALD or CVD.

In embodiments, the metal contact 109 may include one or more of tungsten (W), molybdenum (Mo), rhenium (Re), ruthenium (Ru), osmium (Os), cobalt (Co), rhodium (Rh), iridium (Ir), nickel (Ni), palladium (Pd), platinum (Pt), TiN, VN, NbN, MoN, or WN. The metal contact 109 may be formed as a single layer or a stacked layer using one or more conductive films including a conductive material, e.g., copper (Cu), aluminum (Al), tantalum (Ta), tantalum nitride (TaN), titanium (Ti), the like, and/or a combination thereof.

FIG. 2 schematically illustrates a diagram of another semiconductor device 200 with a Ge substrate 201 and one or more molecular monolayers formed passivation layer 203 above the Ge substrate 201, in accordance with some embodiments. In embodiments, the semiconductor device 200 may be similar to the semiconductor device 100, while the Ge substrate 201 may be similar to the Ge substrate 101. Other layers of the semiconductor device 200 may be similar to corresponding layers of the semiconductor device 100, as described above for FIG. 1.

In embodiments, the semiconductor device 200 may include the Ge substrate 201 and the passivation layer 203 above the Ge substrate 201. Instead of one low-k interlayer shown in FIG. 1, the semiconductor device 200 may include two low-k interlayers, a first low-k interlayer 213, and a second low-k interlayer 205 next to the first low-k interlayer 213. A high-k interlayer 207 may be above the low-k interlayer 205, and a metal contact 209 may be above the high-k interlayer 207.

In embodiments, the passivation layer 203 may include one or more molecular monolayers, and may include molecules of Ge(E), $GeE_xO_y$, or $GeME_xO_y$, where E may be one or more of S, Se, Te, N, P, As, Sb, or Bi, and M may be one or more of Al, Ga, In, Sc, Y, La, Ce, Pr, Nd, Sm, Eu, Gd, Tb, Dy, Ho, Er, Tm, Yb, or Lu. The passivation layer 203 may have a thickness in a range of about 1 angstrom (Å) to about 10 Å. In some embodiments, the passivation layer 203 may include more than one molecular monolayer.

In embodiments, the first low-k interlayer 213 may include $ME_x$, while the second low-k interlayer 205 may include $ME_xO_y$, where E may be one or more of S, Se, Te, N, P, As, Sb, or Bi, and M may be one or more of Al, Ga, In, Sc, Y, La, Ce, Pr, Nd, Sm, Eu, Gd, Tb, Dy, Ho, Er, Tm, Yb, or Lu.

FIG. 3 schematically illustrates a diagram of a transistor 300 including a Ge substrate 301 and one or more molecular monolayers formed passivation layer 303 above the Ge substrate 301, in accordance with some embodiments. In embodiments, the Ge substrate 301 may be similar to the Ge substrate 101, and the passivation layer 303 may be similar to the passivation layer 103. Other layers of the transistor 300 may be similar to corresponding layers of the semiconductor device 100, as described above for FIG. 1.

In embodiments, the transistor 300 may include the Ge substrate 301. A drain 311 and a source 313 may be formed within the Ge substrate 301. The passivation layer 303 may be above the Ge substrate 301. The passivation layer 303 may include one or more molecular monolayers with atoms of one or more group 15 elements or group 16 elements. A low-k interlayer 305 may be above the passivation layer 303. A high-k interlayer 307 may be above the low-k interlayer 305, and a metal contact 309 may be above the high-k interlayer 307. In embodiments, the metal contact 309 may be a gate electrode. The stack of layers above the Ge substrate 301, e.g., the passivation layer 303, the low-k interlayer 305, the high-k interlayer 307, and the metal contact 309 may be similar to the stack of layers shown in FIG. 1. Additionally and alternatively, the transistor 300 may have a stack of layers above the Ge substrate 301 that may be similar to the stack of layers shown in FIG. 2.

Figure 4:
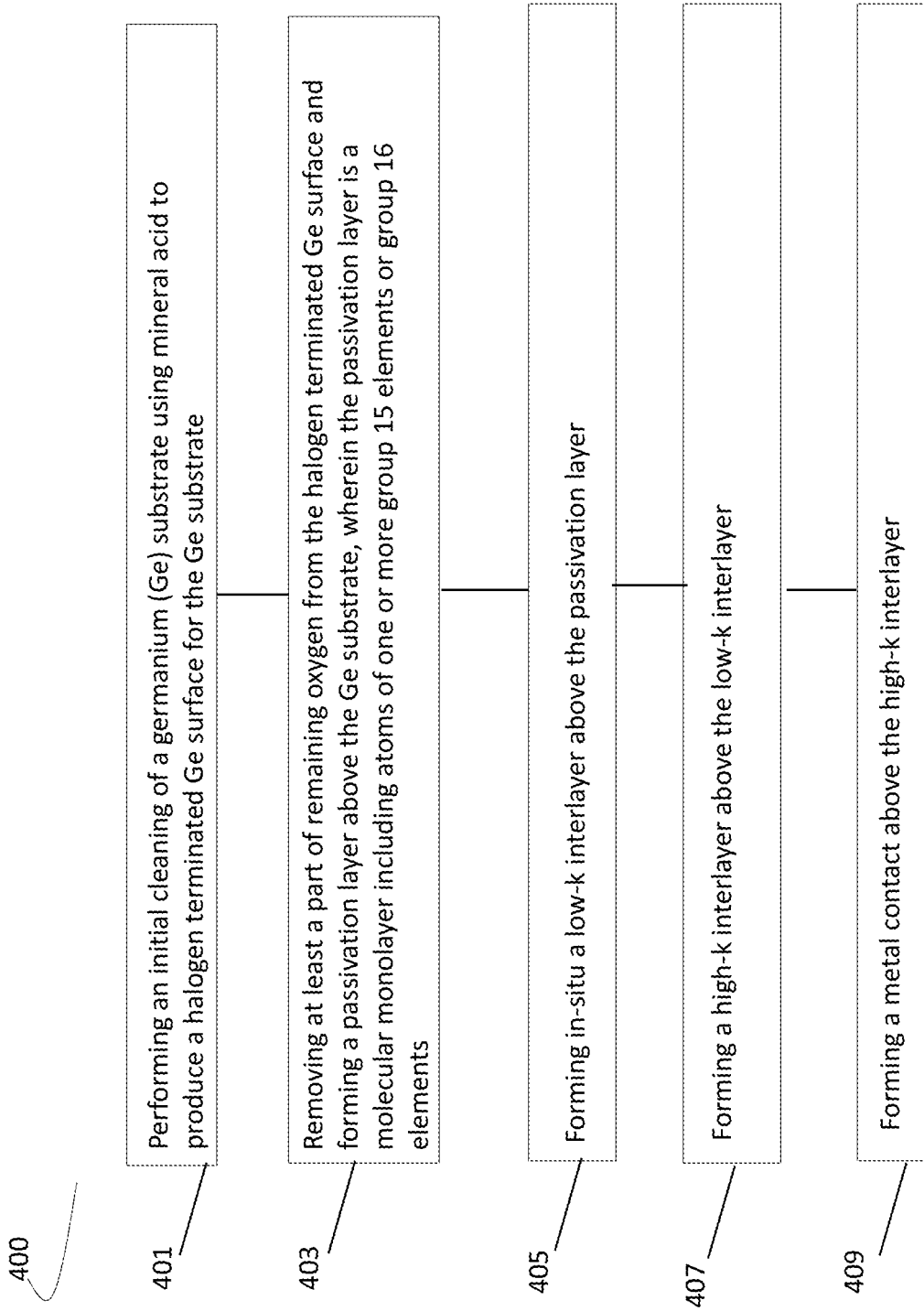
FIG. 4 schematically illustrates a process for forming a semiconductor device with a Ge substrate and one or more molecular monolayers formed passivation layer above the Ge substrate, in accordance with some embodiments.

FIG. 4 schematically illustrates a process 400 for forming a semiconductor device with a Ge substrate and one or more molecular monolayers formed passivation layer above the Ge substrate, in accordance with some embodiments. In embodiments, the process may be applied to form the semiconductor 100 as described above for FIG. 1. Various stages of an application of the process 400 to a Ge substrate, e.g., a Ge substrate 501, may be shown in FIG. 5.

Figure 5:
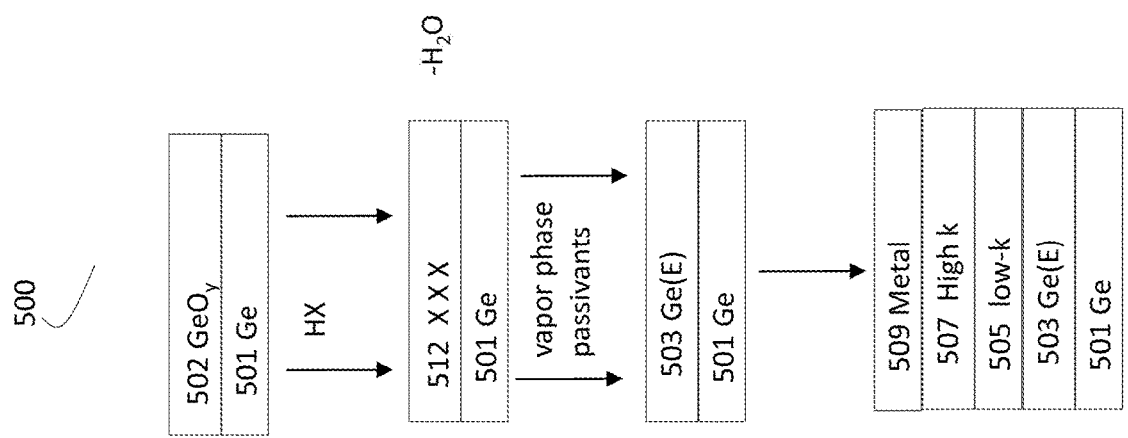
FIG. 5 schematically illustrates various stages of a process for forming a semiconductor device with a Ge substrate and one or more molecular monolayers formed passivation layer above the Ge substrate, in accordance with some embodiments.

At block 401, the process 400 may include performing an initial cleaning of a Ge substrate using mineral acid to produce a halogen terminated Ge surface for the Ge substrate. For example, as shown in FIG. 5, the Ge substrate 501 may be covered by an oxide surface 502 including $GeO_y$. The process 400 may be applied to perform an initial cleaning of the Ge substrate 501 and the oxide surface 502 using one or more moderately concentrated mineral acid HX for a short period of time, e.g., minutes, where X may include fluorine, chlorine (Cl), bromine (Br), Iodine (I). After the initial cleaning, a halogen terminated Ge surface, e.g., a halogen terminated Ge surface 512, may be created for the Ge substrate 501, while majority of the $GeO_x$ of the oxide surface 502 may be removed during the initial cleaning.

At block 403, the process 400 may include removing at least a part of remaining oxygen from the halogen terminated Ge surface and forming a passivation layer above the Ge substrate. The passivation layer may include one or more molecular monolayers with atoms of one or more group 15 elements or group 16 elements. For example, as shown in FIG. 5, the process 400 may be applied to the halogen terminated Ge surface 512 to remove at least a part of remaining oxygen and form a passivation layer 503. In some embodiments, the passivation layer 503 may include one or more molecular monolayers formed by under potential deposition of one or more of S, Se, Te, N, P, As, Sb, or Bi.

Additionally and alternatively, in some embodiments, the process 400 may include exposing in-situ the Ge substrate 501 with the halogen terminated Ge surface 512 to one or more vapor phase passivants to remove at least a part of remaining oxygen from the halogen terminated Ge surface 512 to form the passivation layer 503. In practice, the halogen terminated Ge surface 512 may be heated before exposed to one or more vapor phase passivants. Any remaining oxygen at the halogen terminated Ge surface 512 may be removed through the formation of Si—O bonds in volatile siloxane by-products while surface halogen atoms may be removed through the formation of Si—X bonds, where X=Cl, Br or I. The vapor phase passivants may diffuse into a GeMOx layer to passivate defect states in both the metal oxide and its interface with the underlying Ge substrate 501. At the same time, one or more molecular monolayers of surface GeE may form to passivate the germanium interface. In some embodiments, one or more binary molecular monolayers GeE may be formed as the passivation layer 503. In some other embodiments, one or more ternary or quaternary molecular monolayers may be formed as the passivation layer 503, where E may include one or more of S, Se, Te, N, P, As, Sb, or Bi.

The so formed one or more molecular monolayers as the passivation layer 503 may have improved performance compared to passivation layers formed by other methods. For example, a S passivation layer may be formed by aqueous ammonium sulfide treatment. However, such a sulfur passivation layer may be more than a monolayer thick and may still contain oxygen, since it may form a GeSxOy layer rather than a GeS layer. In addition, the so formed one or more molecular monolayers as the passivation layer 503 may be different from doping E elements into the Ge substrate 501. Doping E elements into the Ge substrate 501 may move atoms of E elements into the bulk of the Ge lattice of the Ge substrate 501, and would not be a surface reaction and passivation. The one or more molecular monolayers as the passivation layer 503 may be a surface reaction and passivation, without having atoms of E elements into the bulk of the Ge substrate 501.

In detail, the passivation layer 503 may include molecules of Ge(E), where E may be one or more of S, Se, Te, N, and the one or more vapor phase passivants may include hydrogen sulfide (H2S), hydrogen selenide (H2Se), alkylthiol (RSH), alkylselenol (RSeH), alklytellurol (RTeH), dialkylsulfide (R2S), dialkylselenide (R2Se), dialkyltelluride (R2Te), dialkyldisulfide (RSSR), dialkyldiselenide (RSeSeR), dialkylditelluride (RTeTeR), disilylsulfide [S(SiR3)2], disilylselenide [Se(SiR3)2], or disilyltelluride [Te(SiR3)2]. In some other embodiments, the passivation layer 503 may include molecules of Ge(E), where E may be one or more of P, As, Sb, or Bi, and the one or more vapor phase passivants may include ammonia, organoamine, hydrazine, organohydrazine, phosphine (PH3), organophosphine, diphosphine, organodiphosphine, arsine (AsH3), organoarsine, diarsine, organodiarsine, trisilylamine [N(SiR3)3], trisilyphosphine [P(SiR3)3], trisilylarsine [As(SiR3)3], trisilylstibine [Sb(SiR3)3], or trisilylbismuth [Bi(SiR3)3].

At block 405, the process 400 may include forming in-situ a low-k interlayer above the passivation layer. At block 407, the process 400 may include forming a high-k interlayer above the low-k interlayer. At block 409, the process 400 may include forming a metal contact above the high-k interlayer. For example, as shown in FIG. 5, the process 400 may be applied to the Ge substrate 501 covered by the passivation layer 503 to form a low-k interlayer 505, a high-k interlayer 507, and a metal contact 509. The process 400 may include forming the low-k interlayer 505 by ALD or CVD, forming the high-k interlayer 507 by ALD or CVD, and further forming the metal contact 509 by physical vapor deposition (PVD), ALD, CVD, electroless deposition (ELD), and/or electroplating.

In addition, the process 400 may also include other operations, not shown. For example, the process 400 may include depositing a metal oxide layer onto the Ge substrate to form a GeMOx layer, wherein M may be one or more of Al, Ga, In, Sc, Y, La, Ce, Pr, Nd, Sm, Eu, Gd, Tb, Dy, Ho, Er, Tm, Yb, or Lu. The process 400 may also include forming a source area and/or a drain area within the Ge substrate 501 to form a Ge substrate based transistor.

Figure 6:
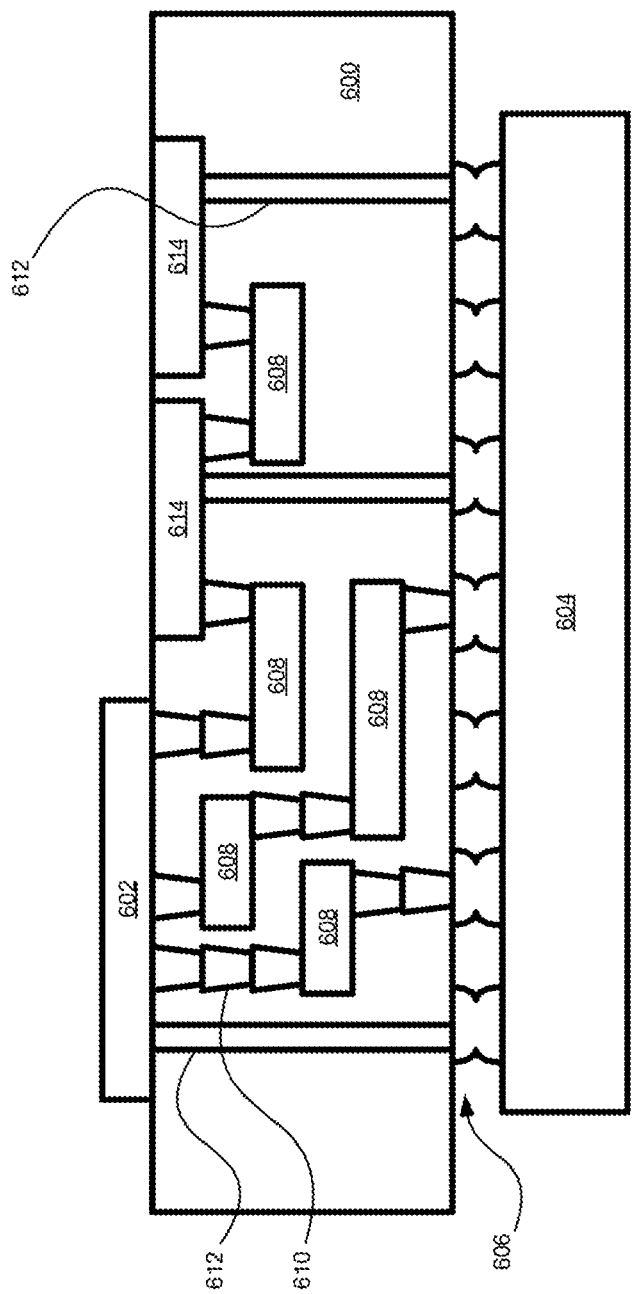
FIG. 6 schematically illustrates an interposer implementing one or more embodiments of the disclosure, in accordance with some embodiments.

FIG. 6 illustrates an interposer 600 that includes one or more embodiments of the disclosure. The interposer 600 is an intervening substrate used to bridge a first substrate 602 to a second substrate 604. The first substrate 602 may be, for instance, a Ge substrate, e.g., the Ge substrate 101, and the passivation layer 103 may be formed above the Ge substrate 101, as shown in FIG. 1. The second substrate 604 may be, for instance, a memory module, a computer motherboard, or another integrated circuit die. Generally, the purpose of an interposer 600 is to spread a connection to a wider pitch or to reroute a connection to a different connection. For example, an interposer 600 may couple an integrated circuit die to a ball grid array (BGA) 606 that can subsequently be coupled to the second substrate 604. In some embodiments, the first and second substrates 602/604 are attached to opposing sides of the interposer 600. In other embodiments, the first and second substrates 602/604 are attached to the same side of the interposer 600. And in further embodiments, three or more substrates are interconnected by way of the interposer 600.

The interposer 600 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 608 and vias 610, including but not limited to through-silicon vias (TSVs) 612. The interposer 600 may further include embedded devices 614, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 600.

In accordance with embodiments of the disclosure, apparatuses or processes disclosed herein may be used in the fabrication of interposer 600.

Figure 7:
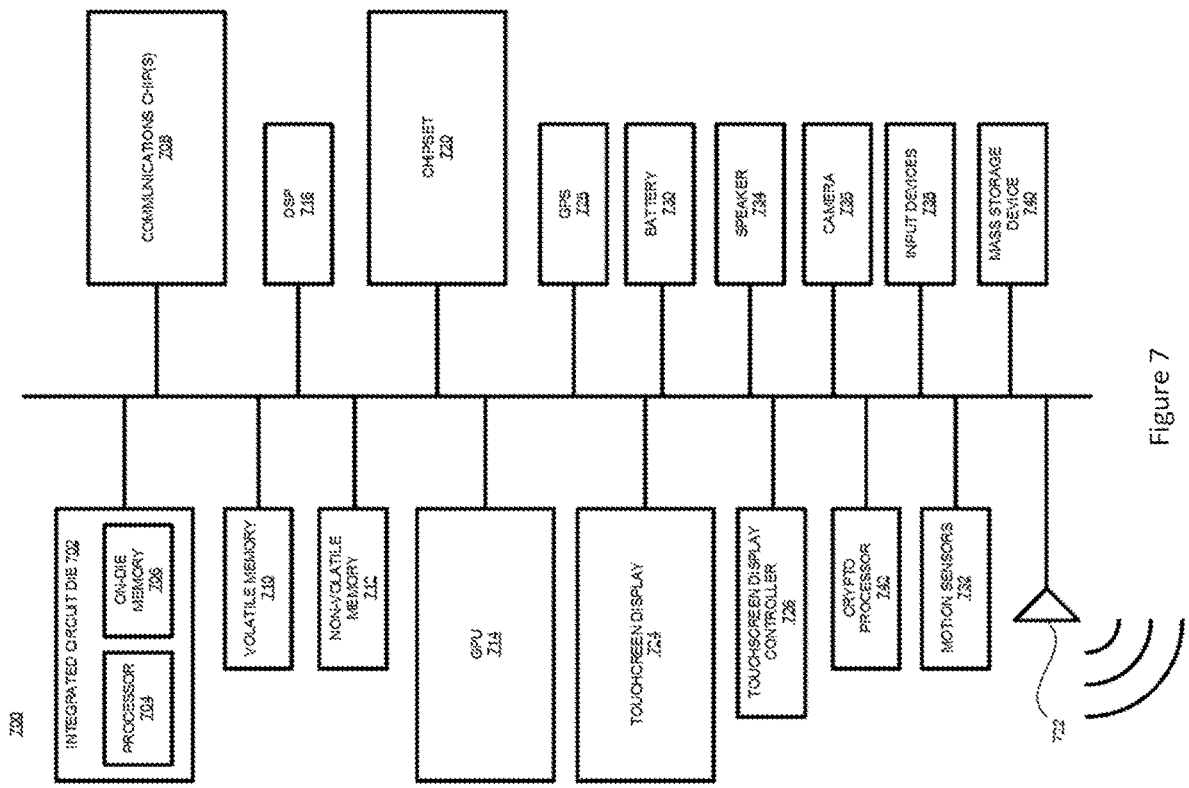
FIG. 7 schematically illustrates a computing device built in accordance with an embodiment of the disclosure, in accordance with some embodiments.

FIG. 7 illustrates a computing device 700 in accordance with one embodiment of the disclosure. The computing device 700 may include a number of components. In one embodiment, these components are attached to one or more motherboards. In an alternate embodiment, some or all of these components are fabricated onto a single system-on-a-chip (SoC) die, such as a SoC used for mobile devices. The components in the computing device 700 include, but are not limited to, an integrated circuit die 702 and at least one communications logic unit 708. In some implementations the communications logic unit 708 is fabricated within the integrated circuit die 702 while in other implementations the communications logic unit 708 is fabricated in a separate integrated circuit chip that may be bonded to a substrate or motherboard that is shared with or electronically coupled to the integrated circuit die 702. The integrated circuit die 702 may include a processor 704 as well as on-die memory 706, often used as cache memory, which can be provided by technologies such as embedded DRAM (eDRAM), or SRAM. In embodiments, the integrated circuit die 702 may include may include transistors, e.g., a transistor similar to the transistor 300 shown in FIG. 3. Furthermore, the integrated circuit die 702 may include the semiconductor device 100 with the Ge substrate 101 and one or more molecular monolayers formed passivation layer 103 above the Ge substrate 101.

In embodiments, the computing device 700 may include a display or a touchscreen display 724, and a touchscreen display controller 726. A display or the touchscreen display 724 may include a FPD, an AMOLED display, a TFT LCD, a micro light-emitting diode (µLED) display, or others.

Computing device 700 may include other components that may or may not be physically and electrically coupled to the motherboard or fabricated within a SoC die. These other components include, but are not limited to, volatile memory 710 (e.g., dynamic random access memory (DRAM), non-volatile memory 712 (e.g., ROM or flash memory), a graphics processing unit 714 (GPU), a digital signal processor (DSP) 716, a crypto processor 742 (e.g., a specialized processor that executes cryptographic algorithms within hardware), a chipset 720, at least one antenna 722 (in some implementations two or more antenna may be used), a battery 730 or other power source, a power amplifier (not shown), a voltage regulator (not shown), a global positioning system (GPS) device 728, a compass, a motion coprocessor or sensors 732 (that may include an accelerometer, a gyroscope, and a compass), a microphone (not shown), a speaker 734, a camera 736, user input devices 738 (such as a keyboard, mouse, stylus, and touchpad), and a mass storage device 740 (such as hard disk drive, compact disk (CD), digital versatile disk (DVD), and so forth). The computing device 700 may incorporate further transmission, telecommunication, or radio functionality not already described herein. In some implementations, the computing device 700 includes a radio that is used to communicate over a distance by modulating and radiating electromagnetic waves in air or space. In further implementations, the computing device 700 includes a transmitter and a receiver (or a transceiver) that is used to communicate over a distance by modulating and radiating electromagnetic waves in air or space.

The communications logic unit 708 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communications logic unit 708 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Infrared (IR), Near Field Communication (NFC), Bluetooth, derivatives thereof, as well as any other wireless protocols that are designated as 3G, 4G, 5G, and beyond. The computing device 700 may include a plurality of communications logic units 708. For instance, a first communications logic unit 708 may be dedicated to shorter range wireless communications such as Wi-Fi, NFC, and Bluetooth and a second communications logic unit 708 may be dedicated to longer range wireless communications such as GPS, EDGE, GPRS, CDMA, WiMAX, LTE, Ev-DO, and others.

The processor 704 of the computing device 700 includes one or more devices, such as transistors. The term "processor" may refer to any device or portion of a device that processes electronic data from registers and/or memory to transform that electronic data into other electronic data that may be stored in registers and/or memory. The communications logic unit 708 may also include one or more devices, such as transistors.

In further embodiments, another component housed within the computing device 700 may contain one or more devices, such as MRAM, or spin-transfer torque memory (STT-MRAM), that are formed in accordance with implementations of the current disclosure, e.g., the memory array 100 shown in FIG. 1, the MRAM memory cell 210 shown in FIG. 2, or a MRAM memory cell formed according to the process 300 shown in FIG. 3.

In various embodiments, the computing device 700 may be a laptop computer, a netbook computer, a notebook computer, an ultrabook computer, a smartphone, a dumbphone, a tablet, a tablet/laptop hybrid, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

Some non-limiting Examples are provided below.

Example 1 may include a semiconductor device, comprising: a germanium (Ge) substrate; a passivation layer above the Ge substrate, wherein the passivation layer includes one or more molecular monolayers with atoms of one or more group 15 elements or group 16 elements; a low-k interlayer above the passivation layer; a high-k interlayer above the low-k interlayer; and a metal contact above the high-k interlayer.

Example 2 may include the semiconductor device of example 1 and/or some other examples herein, wherein the passivation layer includes molecules of Ge(E), $GeE_xO_y$, or $GeME_xO_y$, where E is one or more of sulfur (S), selenium (Se), tellurium (Te), nitrogen (N), phosphorus (P), arsenic (As), antimony (Sb), or bismuth (Bi), and M is one or more of aluminum (Al), gallium (Ga), indium (In), scandium (Sc), yttrium (Y), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu).

Example 3 may include the semiconductor device of any one of examples 1-2 and/or some other examples herein, wherein the passivation layer has a thickness in a range of about 1 angstrom (Å) to about 10 Å.

Example 4 may include the semiconductor device of any one of examples 1-2 and/or some other examples herein, wherein the low-k interlayer includes $MO_x$, MON, $MSiO_x$, or $MGeO_x$, where M is one or more of Al, Ga, In, Sc, Y, La, Ce, Pr, Nd, Sm, Eu, Gd, Tb, Dy, Ho, Er, Tm, Yb, or Lu.

Example 5 may include the semiconductor device of any one of examples 1-2 and/or some other examples herein, wherein the low-k interlayer is a first low-k interlayer, and the semiconductor device further includes a second low-k interlayer next to the first low-k interlayer, the first low-k interlayer includes $ME_xO_y$, and the second low-k interlayer includes $ME_x$ where E is one or more of S, Se, Te, N, P, As, Sb, or Bi, and M is one or more of Al, Ga, In, Sc, Y, La, Ce, Pr, Nd, Sm, Eu, Gd, Tb, Dy, Ho, Er, Tm, Yb, or Lu.

Example 6 may include the semiconductor device of any one of examples 1-2 and/or some other examples herein, wherein the low-k interlayer has a thickness in a range of about 3 Å to about 20 Å.

Example 7 may include the semiconductor device of any one of examples 1-2 and/or some other examples herein, wherein the high-k interlayer includes $MO_x$, $MSiO_x$, or $MGeO_x$, wherein M is one or more of Al, Ga, In, Sc, Y, La, Ce, Pr, Nd, Sm, Eu, Gd, Tb, Dy, Ho, Er, Tm, Yb, Lu, hafnium (Hf), or zirconium (Zr), and an M element in the high-k interlayer is different from an M element in the low-k interlayer.

Example 8 may include the semiconductor device of any one of examples 1-2 and/or some other examples herein, wherein the high-k interlayer has a thickness in a range of about 10 Å to about 50 Å.

Example 9 may include the semiconductor device of any one of examples 1-2 and/or some other examples herein, wherein the metal contact includes one or more of tungsten (W), molybdenum (Mo), rhenium (Re), ruthenium (Ru), osmium (Os), cobalt (Co), rhodium (Rh), iridium (Ir), nickel (Ni), palladium (Pd), platinum (Pt), TiN, VN, NbN, MoN, or WN.

Example 10 may include the semiconductor device of any one of examples 1-2 and/or some other examples herein, wherein the metal contact is a gate electrode, and the semiconductor device further includes a source area and a drain area within the Ge substrate.

Example 11 may include the semiconductor device of any one of examples 1-2 and/or some other examples herein, wherein the Ge substrate is of 100, 111, or 110 crystallographic orientation.

Example 12 may include a method for forming a semiconductor device, the method comprising: performing an initial cleaning of a germanium (Ge) substrate using mineral acid to produce a halogen terminated Ge surface for the Ge substrate; removing at least a part of remaining oxygen from the halogen terminated Ge surface and forming a passivation layer above the Ge substrate, wherein the passivation layer includes one or more molecular monolayers with atoms of one or more group 15 elements or group 16 elements; forming in-situ a low-k interlayer above the passivation layer; forming a high-k interlayer above the low-k interlayer; and forming a metal contact above the high-k interlayer.

Example 13 may include the method of example 12 and/or some other examples herein, wherein the forming the passivation layer includes forming the passivation layer by under potential deposition of one or more of sulfur (S), selenium (Se), tellurium (Te), nitrogen (N), phosphorus (P), arsenic (As), antimony (Sb), or bismuth (Bi).

Example 14 may include the method of example 12 and/or some other examples herein, wherein the forming the passivation layer includes: exposing in-situ the Ge substrate with the halogen terminated Ge surface to one or more vapor phase passivants to remove at least a part of remaining oxygen from the halogen terminated Ge surface to form the passivation layer.

Example 15 may include the method of example 14 and/or some other examples herein, wherein the passivation layer includes molecules of Ge(E), where E is one or more of sulfur (S), selenium (Se), tellurium (Te), nitrogen (N), and the one or more vapor phase passivants include hydrogen sulfide (H2S), hydrogen selenide (H2Se), alkylthiol (RSH), alkylselenol (RSeH), alklytellurol (RTeH), dialkylsulfide (R2S), dialkylselenide (R2Se), dialkyltelluride (R2Te), dialkyldisulfide (RSSR), dialkyldiselenide (RSeSeR), dialkylditelluride (RTeTeR), disilylsulfide [S(SiR3)2], disilylselenide [Se(SiR3)2], or disilyltelluride [Te(SiR3)2].

Example 16 may include the method of example 14 and/or some other examples herein, wherein the passivation layer includes molecules of Ge(E), where E is one or more of phosphorus (P), arsenic (As), antimony (Sb), or bismuth (Bi), and the one or more vapor phase passivants include ammonia, organoamine, hydrazine, organohydrazine, phosphine (PH3), organophosphine, diphosphine, organodiphosphine, arsine (AsH3), organoarsine, diarsine, organodiarsine, trisilylamine [N(SiR3)3], trisilyphosphine [P(SiR3)3], trisilylarsine [As(SiR3)3], trisilylstibine [Sb(SiR3)3], or trisilylbismuth [Bi(SiR3)3].

Example 17 may include the method of example 14 and/or some other examples herein, further comprising: depositing a metal oxide layer onto the Ge substrate to form a GeMOx layer, wherein M is one or more of aluminum (Al), gallium (Ga), indium (In), scandium (Sc), yttrium (Y), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu).

Example 18 may include the method of any one of examples 12-14 and/or some other examples herein, wherein the forming the low-k interlayer or the forming the high-k interlayer includes forming the low-k interlayer or forming the high-k interlayer by atomic layer deposition (ALD) or chemical vapor deposition (CVD).

Example 19 may include the method of any one of examples 12-14 and/or some other examples herein, wherein the forming the metal contact includes forming the metal contact by physical vapor deposition (PVD), ALD, CVD, electroless deposition (ELD) and electroplating.

Example 20 may include a computing device comprising: a processor; a memory device coupled to the processor, wherein the processor or the memory device includes a transistor, and the transistor includes: a germanium (Ge) substrate; a passivation layer above the Ge substrate, wherein the passivation layer includes one or more molecular monolayers with atoms of one or more group 15 elements or group 16 elements; a low-k interlayer above the passivation layer; a high-k interlayer above the low-k interlayer; and a metal contact above the high-k interlayer.

Example 21 may include the computing device of example 20 and/or some other examples herein, wherein the passivation layer includes molecules of Ge(E), $GeE_xO_y$, or $GeME_xO_y$, where E is one or more of sulfur (S), selenium (Se), tellurium (Te), nitrogen (N), phosphorus (P), arsenic (As), antimony (Sb), or bismuth (Bi), and M is one or more of aluminum (Al), gallium (Ga), indium (In), scandium (Sc), yttrium (Y), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu).

Example 22 may include the computing device of any one of examples 20-21 and/or some other examples herein, wherein the low-k interlayer is a first low-k interlayer, and the semiconductor device further includes a second low-k interlayer next to the first low-k interlayer, the first low-k interlayer includes $ME_xO_y$, and the second low-k interlayer includes $ME_x$ where E is one or more of S, Se, Te, N, P, As, Sb, or Bi, and M is one or more of Al, Ga, In, Sc, Y, La, Ce, Pr, Nd, Sm, Eu, Gd, Tb, Dy, Ho, Er, Tm, Yb, or Lu.

Example 23 may include the computing device of any one of examples 20-21 and/or some other examples herein, wherein the low-k interlayer includes $MO_x$ MON, $MSiO_x$, or $MGeO_x$, where M is one or more of Al, Ga, In, Sc, Y, La, Ce, Pr, Nd, Sm, Eu, Gd, Tb, Dy, Ho, Er, Tm, Yb, or Lu.

Example 24 may include the computing device of any one of examples 20-21 and/or some other examples herein, wherein the high-k interlayer includes $MO_x$, $MSiO_x$, or $MGeO_x$, wherein M is one or more of Al, Ga, In, Sc, Y, La, Ce, Pr, Nd, Sm, Eu, Gd, Tb, Dy, Ho, Er, Tm, Yb, Lu, hafnium (Hf), or zirconium (Zr), and an M element in the high-k interlayer is different an M element in the low-k interlayer.

Example 25 may include the computing device of any one of examples 20-21 and/or some other examples herein, wherein the computing device is a wearable device or a mobile computing device, the wearable device or the mobile computing device including one or more of an antenna, a touchscreen controller, a battery, an audio codec, a video codec, a power amplifier, a global positioning system (GPS) device, a compass, a Geiger counter, an accelerometer, a gyroscope, a speaker, or a camera coupled with the processor.

Example 26 may include one or more computer-readable media having instructions for a computer device to form a semiconductor device, upon execution of the instructions by one or more processors, to perform the method of any one of examples 12-19.

Example 27 may include an apparatus for forming a semiconductor device, comprising: means for performing an initial cleaning of a germanium (Ge) substrate using mineral acid to produce a halogen terminated Ge surface for the Ge substrate; means for removing at least a part of remaining oxygen from the halogen terminated Ge surface and forming a passivation layer above the Ge substrate, wherein the passivation layer includes one or more molecular monolayers with atoms of one or more group 15 elements or group 16 elements; means for forming in-situ a low-k interlayer above the passivation layer; means for forming a high-k interlayer above the low-k interlayer; and means for forming a metal contact above the high-k interlayer.

Example 28 may include the apparatus of example 27 and/or some other examples herein, wherein the means for forming the passivation layer includes means for forming the passivation layer by under potential deposition of one or more of sulfur (S), selenium (Se), tellurium (Te), nitrogen (N), phosphorus (P), arsenic (As), antimony (Sb), or bismuth (Bi).

Example 29 may include the apparatus of example 27 and/or some other examples herein, wherein the means for forming the passivation layer includes: means for exposing in-situ the Ge substrate with the halogen terminated Ge surface to one or more vapor phase passivants to remove at least a part of remaining oxygen from the halogen terminated Ge surface to form the passivation layer.

Example 30 may include the apparatus of example 29 and/or some other examples herein, wherein the passivation layer includes molecules of Ge(E), where E is one or more of sulfur (S), selenium (Se), tellurium (Te), nitrogen (N), and the one or more vapor phase passivants include hydrogen sulfide (H2S), hydrogen selenide (H2Se), alkylthiol (RSH), alkylselenol (RSeH), alklytellurol (RTeH), dialkylsulfide (R2S), dialkylselenide (R2Se), dialkyltelluride (R2Te), dialkyldisulfide (RSSR), dialkyldiselenide (RSeSeR), dialkylditelluride (RTeTeR), disilylsulfide [S(SiR3)2], disilylselenide [Se(SiR3)2], or disilyltelluride [Te(SiR3)2].

Example 31 may include the apparatus of example 29 and/or some other examples herein, wherein the passivation layer includes molecules of Ge(E), where E is one or more of phosphorus (P), arsenic (As), antimony (Sb), or bismuth (Bi), and the one or more vapor phase passivants include ammonia, organoamine, hydrazine, organohydrazine, phosphine (PH3), organophosphine, diphosphine, organodiphosphine, arsine (AsH3), organoarsine, diarsine, organodiarsine, trisilylamine [N(SiR3)3], trisilyphosphine [P(SiR3)3], trisilylarsine [As(SiR3)3], trisilylstibine [Sb(SiR3)3], or trisilylbismuth [Bi(SiR3)3].

Example 32 may include the apparatus of example 29 and/or some other examples herein, further comprising: means for depositing a metal oxide layer onto the Ge substrate to form a GeMOx layer, wherein M is one or more of aluminum (Al), gallium (Ga), indium (In), scandium (Sc), yttrium (Y), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu).

Example 33 may include the apparatus of any one of examples 27-29 and/or some other examples herein, wherein the means for forming the low-k interlayer or the means for forming the high-k interlayer includes means for forming the low-k interlayer or means for forming the high-k interlayer by atomic layer deposition (ALD) or chemical vapor deposition (CVD).

Example 34 may include the apparatus of any one of examples 27-29 and/or some other examples herein, wherein the means for forming the metal contact includes means for forming the metal contact by physical vapor deposition (PVD), ALD, CVD, electroless deposition (ELD) and electroplating.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. A semiconductor device, comprising:
a germanium (Ge) substrate;
a passivation layer above the Ge substrate, wherein the passivation layer includes one or more molecular monolayers with atoms of one or more group 15 elements or group 16 elements;
a low-k interlayer above the passivation layer, wherein the low-k interlayer has a small dielectric constant relative to a dielectric constant of silicon dioxide;
a high-k interlayer above the low-k interlayer; and
a metal contact above the high-k interlayer.

2. The semiconductor device of claim 1, wherein the passivation layer includes molecules of Ge(E), $GeE_xO_y$, or $GeME_xO_y$, where E is one or more of sulfur (S), selenium (Se), tellurium (Te), nitrogen (N), phosphorus (P), arsenic (As), antimony (Sb), or bismuth (Bi), and M is one or more of aluminum (Al), gallium (Ga), indium (In), scandium (Sc), yttrium (Y), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu).

3. The semiconductor device of claim 1, wherein the passivation layer has a thickness in a range of about 1 angstrom (Å) to about 10 Å.

4. The semiconductor device of claim 1, wherein the low-k interlayer includes $MO_x$, MON, $MSiO_x$, or $MGeO_x$, where M is one or more of Al, Ga, In, Sc, Y, La, Ce, Pr, Nd, Sm, Eu, Gd, Tb, Dy, Ho, Er, Tm, Yb, or Lu.

5. The semiconductor device of claim 1, wherein the low-k interlayer is a first low-k interlayer, and the semiconductor device further includes a second low-k interlayer next to the first low-k interlayer, the first low-k interlayer includes $ME_xO_y$, and the second low-k interlayer includes $ME_x$ where E is one or more of S, Se, Te, N, P, As, Sb, or Bi, and M is one or more of Al, Ga, In, Sc, Y, La, Ce, Pr, Nd, Sm, Eu, Gd, Tb, Dy, Ho, Er, Tm, Yb, or Lu.

6. The semiconductor device of claim 1, wherein the low-k interlayer has a thickness in a range of about 3 Å to about 20 Å.

7. The semiconductor device of claim 1, wherein the high-k interlayer includes $MO_x$, $MSiO_x$, or $MGeO_x$, wherein M is one or more of Al, Ga, In, Sc, Y, La, Ce, Pr, Nd, Sm, Eu, Gd, Tb, Dy, Ho, Er, Tm, Yb, Lu, hafnium (Hf), or zirconium (Zr), and an M element in the high-k interlayer is different from an M element in the low-k interlayer.

8. The semiconductor device of claim 1, wherein the high-k interlayer has a thickness in a range of about 10 Å to about 50 Å.

9. The semiconductor device of claim 1, wherein the metal contact includes one or more of tungsten (W), molybdenum (Mo), rhenium (Re), ruthenium (Ru), osmium (Os), cobalt (Co), rhodium (Rh), iridium (Ir), nickel (Ni), palladium (Pd), platinum (Pt), TiN, VN, NbN, MoN, or WN.

10. The semiconductor device of claim 1, wherein the metal contact is a gate electrode, and the semiconductor device further includes a source area and a drain area within the Ge substrate.

11. The semiconductor device of claim 1, wherein the Ge substrate is of 100, 111, or 110 crystallographic orientation.

12. A method for forming a semiconductor device, the method comprising:
performing an initial cleaning of a germanium (Ge) substrate using mineral acid to produce a halogen terminated Ge surface for the Ge substrate;
removing at least a part of remaining oxygen from the halogen terminated Ge surface and forming a passivation layer above the Ge substrate, wherein the passivation layer includes one or more molecular monolayers with atoms of one or more group 15 elements or group 16 elements;
forming in-situ a low-k interlayer above the passivation layer;
forming a high-k interlayer above the low-k interlayer; and
forming a metal contact above the high-k interlayer.

13. The method of claim 12, wherein the forming the passivation layer includes forming the passivation layer by under potential deposition of one or more of sulfur (S), selenium (Se), tellurium (Te), nitrogen (N), phosphorus (P), arsenic (As), antimony (Sb), or bismuth (Bi).

14. The method of claim 12, wherein the forming the passivation layer includes:
exposing in-situ the Ge substrate with the halogen terminated Ge surface to one or more vapor phase passivants to remove at least a part of remaining oxygen from the halogen terminated Ge surface to form the passivation layer.

15. The method of claim 14, wherein the passivation layer includes molecules of Ge(E), where E is one or more of sulfur (S), selenium (Se), tellurium (Te), nitrogen (N), and the one or more vapor phase passivants include hydrogen sulfide (H2S), hydrogen selenide (H2Se), alkylthiol (RSH), alkylselenol (RSeH), alklytellurol (RTeH), dialkylsulfide (R2S), dialkylselenide (R2Se), dialkyltelluride (R2Te), dialkyldisulfide (RSSR), dialkyldiselenide (RSeSeR), dialkylditelluride (RTeTeR), disilylsulfide [S(SiR3)2], disilylselenide [Se(SiR3)2], or disilyltelluride [Te(SiR3)2].

16. The method of claim 14, wherein the passivation layer includes molecules of Ge(E), where E is one or more of phosphorus (P), arsenic (As), antimony (Sb), or bismuth (Bi), and the one or more vapor phase passivants include ammonia, organoamine, hydrazine, organohydrazine, phosphine (PH3), organophosphine, diphosphine, organodiphosphine, arsine (AsH3), organoarsine, diarsine, organodiarsine, trisilylamine [N(SiR3)3], trisilyphosphine [P(SiR3)3], trisilylarsine [As(SiR3)3], trisilylstibine [Sb(SiR3)3], or trisilylbismuth [Bi(SiR3)3].

17. The method of claim 14, further comprising:
depositing a metal oxide layer onto the Ge substrate to form a GeMOx layer, wherein M is one or more of aluminum (Al), gallium (Ga), indium (In), scandium (Sc), yttrium (Y), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu).

18. The method of claim 12, wherein the forming the low-k interlayer or the forming the high-k interlayer includes forming the low-k interlayer or forming the high-k interlayer by atomic layer deposition (ALD) or chemical vapor deposition (CVD).

19. The method of claim 12, wherein the forming the metal contact includes forming the metal contact by physical vapor deposition (PVD), ALD, CVD, electroless deposition (ELD) and electroplating.

20. A computing device comprising:
a processor;
a memory device coupled to the processor, wherein the processor or the memory device includes a transistor, and the transistor includes:
a germanium (Ge) substrate;
a passivation layer above the Ge substrate, wherein the passivation layer includes one or more molecular monolayers with atoms of one or more group 15 elements or group 16 elements;
a low-k interlayer above the passivation layer, wherein the low-k interlayer has a small dielectric constant relative to a dielectric constant of silicon dioxide;
a high-k interlayer above the low-k interlayer; and
a metal contact above the high-k interlayer.

21. The computing device of claim 20, wherein the passivation layer includes molecules of Ge(E), $GeE_xO_y$, or $GeME_xO_y$, where E is one or more of sulfur (S), selenium (Se), tellurium (Te), nitrogen (N), phosphorus (P), arsenic (As), antimony (Sb), or bismuth (Bi), and
M is one or more of aluminum (Al), gallium (Ga), indium (In), scandium (Sc), yttrium (Y), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu).

22. The computing device of claim 20, wherein the low-k interlayer is a first low-k interlayer, and the semiconductor device further includes a second low-k interlayer next to the first low-k interlayer, the first low-k interlayer includes $ME_xO_y$, and the second low-k interlayer includes $ME_x$ where E is one or more of S, Se, Te, N, P, As, Sb, or Bi, and M is one or more of Al, Ga, In, Sc, Y, La, Ce, Pr, Nd, Sm, Eu, Gd, Tb, Dy, Ho, Er, Tm, Yb, or Lu.

23. The computing device of claim 20, wherein the low-k interlayer includes $MO_x$, MON, $MSiO_x$, or $MGeO_x$, where M is one or more of Al, Ga, In, Sc, Y, La, Ce, Pr, Nd, Sm, Eu, Gd, Tb, Dy, Ho, Er, Tm, Yb, or Lu.

24. The computing device of claim 20, wherein the high-k interlayer includes $MO_x$, $MSiO_x$, or $MGeO_x$, wherein M is one or more of Al, Ga, In, Sc, Y, La, Ce, Pr, Nd, Sm, Eu, Gd, Tb, Dy, Ho, Er, Tm, Yb, Lu, hafnium (Hf), or zirconium (Zr), and an M element in the high-k interlayer is different from an M element in the low-k interlayer.

25. The computing device of claim 20, wherein the computing device is a wearable device or a mobile computing device, the wearable device or the mobile computing device including one or more of an antenna, a touchscreen controller, a battery, an audio codec, a video codec, a power amplifier, a global positioning system (GPS) device, a compass, a Geiger counter, an accelerometer, a gyroscope, a speaker, or a camera coupled with the processor.

26. A semiconductor device, comprising:
a germanium (Ge) substrate;
a passivation layer above the Ge substrate, wherein the passivation layer includes one or more molecular monolayers with atoms of one or more group 15 elements or group 16 elements;
a first low-k interlayer above the passivation layer;
a second low-k interlayer over the first low-k interlayer, wherein the first low-k interlayer includes $ME_xO_y$, and the second low-k interlayer includes ME, where E is one or more of S, Se, Te, N, P, As, Sb, or Bi, and M is one or more of Al, Ga, In, Sc, Y, La, Ce, Pr, Nd, Sm, Eu, Gd, Tb, Dy, Ho, Er, Tm, Yb, or Lu;
a high-k interlayer above the low-k interlayer; and
a metal contact above the high-k interlayer.

* * * * *